(12) United States Patent
Grant

(10) Patent No.: US 6,261,373 B1
(45) Date of Patent: Jul. 17, 2001

(54) METHOD AND APPARATUS FOR METAL OXIDE CHEMICAL VAPOR DEPOSITION ON A SUBSTRATE SURFACE

(75) Inventor: Robert W. Grant, Allentown, PA (US)

(73) Assignee: Primaxx, Inc., Allentown, PA (US)

( * ) Notice: Subject to any disclaimer, the term of this patent is extended or adjusted under 35 U.S.C. 154(b) by 0 days.

(21) Appl. No.: 09/352,080

(22) Filed: Jul. 14, 1999

Related U.S. Application Data

(62) Division of application No. 09/272,036, filed on Mar. 18, 1999.

(51) Int. Cl.$^7$ .................................................. C23C 16/00
(52) U.S. Cl. ....................... 118/725; 118/715; 118/722; 118/728
(58) Field of Search ............................ 118/715, 725, 118/728, 722

(56) References Cited

U.S. PATENT DOCUMENTS

| | | |
|---|---|---|
| 4,705,700 | 11/1987 | Ikeda et al. . |
| 4,916,089 | 4/1990 | Van Suchtelen et al. . |
| 4,969,416 | 11/1990 | Schumaker et al. . |
| 5,037,775 | 8/1991 | Reisman . |
| 5,273,932 | 12/1993 | Sugiura et al. . |
| 5,288,327 | 2/1994 | Bhat . |
| 5,365,877 | 11/1994 | Kubota . |
| 5,433,169 | 7/1995 | Nakamura . |
| 5,688,331 * | 11/1997 | Aruga ................................ 118/725 |
| 5,755,878 | 5/1998 | Habuka et al. . |
| 5,814,561 | 9/1998 | Jackson . |
| 6,013,319 * | 1/2000 | Dietze ................................ 118/730 |
| 6,099,648 * | 8/2000 | Anderson ............................ 118/730 |

FOREIGN PATENT DOCUMENTS

| | | |
|---|---|---|
| 61-295461 * | 6/1988 | (JP) . |
| 1-298169 * | 12/1989 | (JP) . |
| 5-144657 * | 11/1993 | (JP) . |
| 8-115911 * | 5/1996 | (JP) . |

\* cited by examiner

*Primary Examiner*—Richard Bueker
(74) *Attorney, Agent, or Firm*—Hugh D. Jaeger

(57) ABSTRACT

A method and apparatus for improved metal oxide chemical vapor deposition on a substrate surface where the application boundary layer is reduced and where the uniformity of the application boundary layer is greatly enhanced in a reactor. Primary and secondary sonic or other disturbance sources are introduced to the interior chamber or an oscillating chuck is incorporated to influence the boundary layer thickness and uniformity.

9 Claims, 2 Drawing Sheets

METHOD AND APPARATUS FOR METAL OXIDE CHEMICAL VAPOR DEPOSITION ON A SUBSTRATE SURFACE

CROSS REFERENCES TO CO-PENDING APPLICATIONS

This application is a division, of application Ser. No. 09/272,036, filed Mar. 18, 1999.

BACKGROUND OF THE INVENTION

1. Field of the Invention

The present invention is for a chemical vapor deposition (CVD), and more particularly, pertains to a method and apparatus for metal oxide chemical vapor deposition (MOCVD) upon a substrate surface.

2. Description of the Prior Art

Several difficulties in prior art metal oxide chemical vapor deposition have been found to be prevalent in the deposition of metal oxide chemical vapors upon a substrate, such as utilized for micro-chip manufacturing or other purposes. Difficulties encountered during deposition are created in the most by (a) undesirable topology on the substrate surface, (b) non-uniform heating of the substrate, and (c) by a non-uniform gas boundary layer along and about the substrate.

The first problem in MOCVD is related to undesirable and inherent substrate topology where at low pressures, such as 1 Torr, MOCVD best takes place, the different vapor components necessary to thermally decompose on a wafer surface in perfect stoichiometry for a particularly useful compound must arrive at the wafer surface at the correct ratio. If the wafer substrate surface were always flat, this ratio could be achieved by simply altering the relative mixture of the vapors, i.e., 10/90 percent to 11/89 percent. However, in most useful cases in integrated circuit construction, inherent uneven topology is usually present, i.e., 0.50 micron high plateaus with 0.25 micron spaces. In this case, each vapor component must arrive not only at the top of the topology features at the correct ratio, but must also arrive at the bottom of the topology features at the same ratio. If the deposition ratio is not maintained, then the composition of the complex metal oxide will be non-uniform and will not be useful. Since a gas boundary layer is usually present for a chemical vapor deposition (CVD) reactor with flowing gases of about 0.80 cm at 760 Torr, for example, for an 8 inch wafer $bl=2/3L(v/UL)^{0.50}$, each vapor component must replenish the boundary layer. Furthermore, different depths within the boundary layer must get the same ratio of vapors in order to allow uniform compositions to form from thermal decomposition. Generally, different metal containing Metalorganic vapors diffuse at different speeds, as to most gases in general. The basic problem with the current art and prior art is that on uneven topography, uniform compound electrical and crystalline control is difficult, at best. Since the use of the dozens of new complex metal oxides will become prevalent, it is important to develop production methods to deposit the compounds that have been studied in planar applications.

The solution to the uneven topology problem, such as presented by the present invention, is to artificially reduce the boundary layer to significantly smaller and uniform thickness, such as in microns. The boundary layer thickness can be significantly reduced and the boundary layer uniformity can be enhanced and stabilized by any one method or combinations of methods including the use of an externally generated periodically disturbed gas motion in the form of a pressure wave, or by moving or oscillating the wafer itself, or by changing the pressure of the injected gas, any or all in the range of Hz through kilo Hz. With reference to reducing boundary layer thickness, Appendix A is attached. Eg. $bl=(v/pi.fr.d)$ where v=viscosity, pi is 3.14, etc., fr=frequency, and d=density of the gas. Appendix A is a spreadsheet relating to various fluids and gases over an 8 inch wafer with no disturbance, and with either 40,000 Hz for water and 10 Hz for the N2 and Argon, where the change in boundary layer (bl) is orders of magnitude.

If the boundary layer is made small, then the compound variation due to differential diffusion lengths will also be small, thereby offering a solution for the problem of two and three chemical component MOCVD. An additional benefit is the speeding up of the deposition rate since most MOCVD reactions are limited by the delivery to the surface through a thick boundary layer.

The second and third prior art problems in MOCVD are the creation of uniform heating and a uniform gas boundary layer of any thickness. Improved uniformity of the gas layer boundary is accomplished in the present invention in part or wholly as previously described. Usually, a prior art rotating wafer in a downflow creates a uniform boundary layer, independent of scale. The speed of rotation controls, to a certain extent, the thickness. Physical rotation is limited by a vacuum rotating seal and particle problems in prior art devices. Rotation is also helpful or necessary in creating uniform lamp heating and is the subject of several existing patents, such as in Applied Materials, etc. If a prior art stationary platen is used to heat the wafer uniformly, then the gas boundary layer will be non-uniform from the center to the edge with the center being thicker and the edge being a thinner boundary layer or the gradient will either increase or decrease from left to right accordingly. The preferred embodiment of the present invention provides for crossflow longitudinally and laterally along the substrate structure. If prior art rotation is used to make the boundary layer uniform, then a rotating vacuum seal is necessary, and lamp heating is necessary which is inherently non-uniform due to re-radiation differences at the edges of the wafer where radiation emits from all sides instead of just one side. Usually prior art multiple heat zones and multiple pyrometer feedback zones are used to compensate for non-uniformities. As well as gas delivery uniformity, temperature drives the reaction, so temperature uniformity is critical. The present invention eliminates the need for pyrometry since it is non-rotating and allows the use of contacting thermocouples imbedded in the heated stage. Multiple heat zones are eliminated since a large mass-conducting heated static chuck is used.

In the present invention, the new boundary layer created by the periodical disturbance gas motion stabilizes the boundary layer thickness and reduces the usual thick boundary layer to a mere fraction, and gas delivery and temperature uniformity are achieved utilizing simple reactor construction. The vapors or gases are sent into the reactor with associated pressure waves, transmitted pressure waves from a transducer, a vibrating or oscillating wafer chuck, or other suitable device.

SUMMARY OF THE INVENTION

The invention discloses and provides a method and apparatus for metal oxide chemical vapor deposition on a substrate surface providing a crossflow and a downflow reactor. The preferred embodiment of the present invention includes a crossflow reactor having a centrally located oscillatible static chuck for grasping a substrate. A gas inlet in the one end of the crossflow reactor is plumbed to a primary disturbance source which generates periodic disturbances in wave form. Generated periodic disturbances are transferred through a sealed chamber and bellows arrangement to influence boundary layer delivery of metal oxide chemical vapor to the substrate surface. The boundary layer is minimized by the periodic disturbances to provide for greatly reduced and desirable boundary layer thickness. The boundary layer uniformity is also enhanced by the generated periodic disturbance. Additional disturbance can also be provided by oscillating the static chuck to reduce boundary layer thickness and to favorably influence the boundary layer uniformity. The chuck also provides a uniformly heated surface which enhances the thermal boundary layer uniformity. An alternate disturbance source is also provided to generate periodic disturbances to the interior of the crossflow reactor by use of a transducer.

The preferred embodiment of this invention is the crossflow reactor since (1) the crossflow reactor limits the volume of gas required, and (2) the crossflow reactor provides an even heating from wafer to opposite surface to produce uniform thermal gradients.

One significant aspect and feature of the present invention is the reduction of boundary layer thickness to provide for improved deposition on and about the uneven topology surfaces of a substrate.

Another significant aspect and feature of the present invention is improved uniformity of the boundary layer to provide for improved deposition on and about the uneven topology surfaces of a substrate.

A further significant aspect and feature of the present invention is the use of primary and alternate disturbance sources either singularly or in unison to reduce boundary layer thickness and to provide for uniformity of the boundary layer.

An additional significant aspect and feature of the present invention is the use of an oscillatible chuck to reduce boundary layer thickness and to provide for uniformity of the boundary layer.

Still another significant aspect and feature of the present invention is the use of an evenly heated chuck.

Yet another significant aspect and feature of the present invention is the use of a downflow reactor.

Still another significant aspect and feature of the present invention is the use of a crossflow reactor.

Having thus described embodiments and significant aspects and features of the present invention, it is the principal object of the present invention to provide a method and apparatus for metal oxide chemical vapor deposition on a substrate surface.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
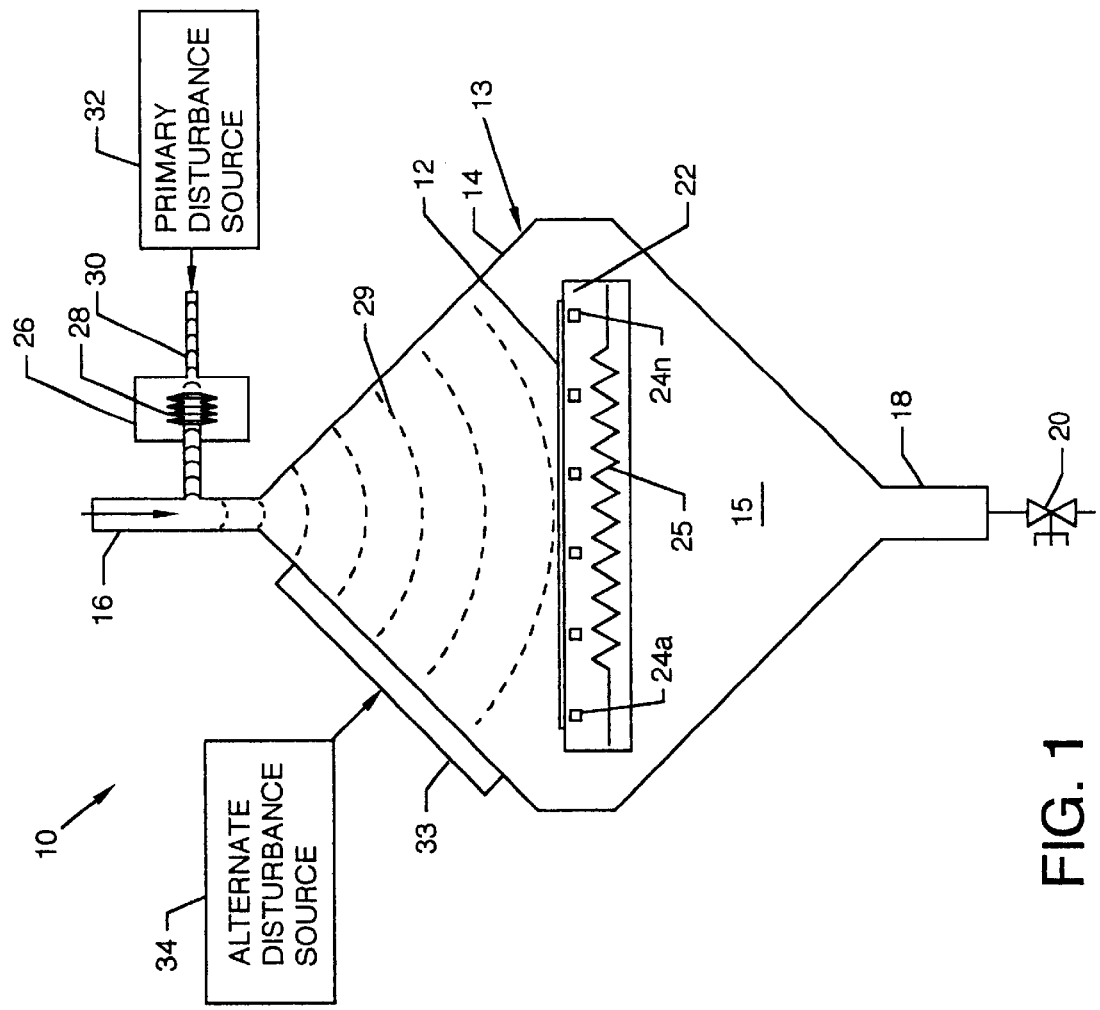
FIG. 1 illustrates the method and a downflow reactor apparatus for metal oxide chemical vapor deposition on a substrate surface; and, FIG. 2, the preferred embodiment, illustrates the method and a crossflow reactor apparatus for metal oxide chemical vapor deposition on one or more substrate surfaces.

FIG. 1 illustrates the method and apparatus for Metal Oxide Chemical Vapor Deposition on a substrate surface. A downflow reactor 10 apparatus is incorporated and utilized for Metal Oxide Chemical Vapor Deposition (MOCVD) upon the upper surface of a substrate 12 positioned central to the downflow reactor 10. The downflow reactor 10 is a cold wall vacuum reactor having a surrounding vessel wall 14 about and to which related structure and devices are attached or extend therefrom. A gas inlet 16 for receiving a gas from the Mass Flow Controller (MFC) is located at the upper region of the downflow reactor 10. Opposing the gas inlet 16 and located at the lower region of the downflow reactor 10 is a gas outlet 18 to which a metering valve 20 for control of the transitting gases through the vessel 14 is attached. A static chuck 22, which is utilized to secure the substrate 12, is centrally located within the surrounding vessel wall 14. The static chuck 22 of large and sufficient mass is resistively heated and can be vibrated or oscillated at a low frequency either vertically or horizontally, or in the alternative can be vibrated or oscillated at a low frequency simultaneously both vertically and horizontally to assist in control of reduced boundary layer thickness and to contribute to boundary layer uniformity control. The relatively large mass of the static chuck 22 is conducive to appropriate uniform and even temperature distribution across the static chuck 22 to enhance boundary layer control. A plurality of thermocouples 24a–24n and a suitable resistance heater 25 are embedded in the static chuck 22 for monitoring and control of the static chuck 22 temperature. A chamber 26 is located at and attached to the gas inlet 16 at the upper region of the downflow reactor 10. An isolation bellows 28 is located in the chamber 26. An inlet 30 is attached to the chamber 26 to receive a disturbance input from a primary disturbance source 32. The primary disturbance source 32 introduces periodic disturbances to the downflow reactor 10 through the inlet 30, the chamber 26, the isolation bellows 28 and the gas inlet 16. The periodic disturbances 29 emanating from the primary disturbance source 32 can be provided by, but not limited to, devices such as a pneumatic oscillator which provide a sinusoidal disturbance. One or more transducers 33 and alternate disturbance sources 34 are attached to the vessel wall 14 to provide additional periodic disturbance either acting as an additional single unit for imparting a disturbance to the downflow reactor 10 or acting in concert with the primary disturbance source 32 to impart multiple or reinforced disturbances to the downflow reactor 10. Both the primary and the alternate disturbance sources 32 and 34 respectively can include but are not limited to a pneumatic oscillator, a speaker, a piezo or other electromagnetic device, a bellows with a pneumatic source, a pneumatic oscillator or other device which generates an appropriate disturbance.

Figure 2:
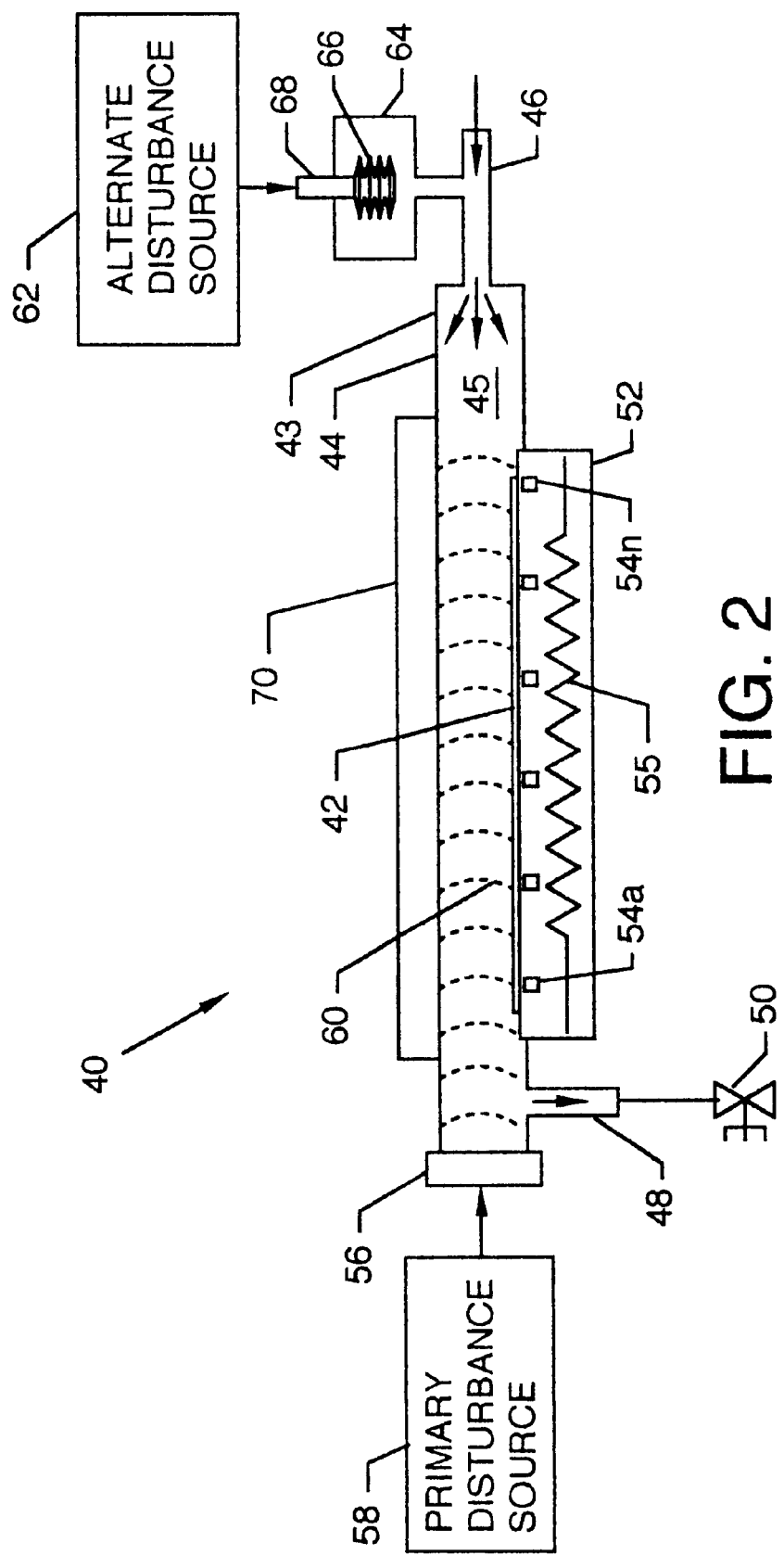

FIG. 2, the preferred embodiment, illustrates the method and apparatus for Metal Oxide Chemical Vapor Deposition on a substrate surface. A horizontally aligned crossflow reactor 40 apparatus is incorporated and utilized for Metal Oxide Chemical Vapor Deposition (MOCVD) upon the upper surface of a substrate 42 positioned central to the crossflow reactor 40. The crossflow reactor 40 is a cold wall vacuum reactor having a surrounding vessel wall 60 about and to which related structure and devices are attached or extend therefrom. A gas inlet 46 for receiving a gas from the Mass Flow Controller (MFC) is located at one end of the crossflow reactor 40. Opposing the gas inlet 46 and located at the opposing end of the crossflow reactor 40 is a gas outlet 48 to which a metering valve 50 for control of the transitting gases through the vessel 44 is attached. A static chuck 52, which is utilized to secure the substrate 42, s centrally located and extends through the surrounding vessel wall 44. At least one or more wafers are flush to the surface of the crossflow reactor 40 to reduce gas flow while having good laminar flow. The static chuck 52 of large and sufficient mass is resistively heated and can be vibrated or oscillated vertically or horizontally, or in the alternative can be vibrated or oscillated simultaneously both vertically and horizontally to assist in control of reduced boundary layer thickness and to contribute to boundary layer uniformity control. The relatively large mass of the static chuck 52 is conducive to appropriate uniform and even temperature distribution and to having an even reaction across the static chuck 52 to enhance boundary layer control. One or more thermocouples 54a–54n and a resistance heater 55 are embedded in the static chuck 52 for monitoring and control of the static chuck 52 temperature. One or more transducers 56 and primary disturbance sources 58, preferably in a location opposite to the gas inlet 46, are attached to the end or other suitable site on the vessel wall 44 to provide periodic disturbance acting to impart a disturbance to the crossflow reactor 40. The periodic disturbances 60 emanating from the primary disturbance source 58 can be provided by, but not limited to, devices such as a pneumatic oscillator which provide a sinusoidal disturbance. With respect to an alternate disturbance source 62, a chamber 64 is located at and attached to the gas inlet 46 at the end of the crossflow reactor 40. An isolation bellows 66 is located in the chamber 64. An inlet 68 is attached to the chamber 64 to receive a disturbance input from the alternate disturbance source 62. The alternate disturbance source 62 introduces periodic disturbances to the crossflow reactor 40 through the inlet 68, the chamber 64, the isolation bellows 66 and the gas inlet 46. Both the primary and the alternate disturbance sources 58 and 62, respectively, and the additional transducer 70 can include but are not limited to a pneumatic oscillator, a speaker, a piezo or other electromagnetic device, a bellows with a pneumatic source, a pneumatic oscillator or other device which generates an appropriate disturbance.

In use, the primary disturbance source 58 and transducer 56 can be used as a stand device for introduction of periodic disturbance, but in the alternative can incorporate the additional and simultaneous use of the transducer 70 located on the vessel wall 44. In a similar fashion, the alternate disturbance source 62, including the delivery components, can be used as a stand-alone device for introduction of periodic disturbances, but in the alternative can incorporate the additional and simultaneous use of the transducer 70 located on the vessel wall 44. Other combinations incorporating the use of one or more disturbance sources, transducers and the like are also included in the scope of the invention.

Any suitable reactor can be utilized such as crossflow or downflow or even an atmospheric pressure reactor that uses gas and boundary layer technology. Any reactor that depends on a uniform and thin boundary layer can include CVD, MOCVD, MBE, LPE and VPE.

Various modifications can be made to the present invention without departing from the apparent scope hereof.

Method and Apparatus for Metal Oxide Chemical Vapor Deposition on a Substrate Surface

| PARTS LIST | |
| --- | --- |
| 10 | downflow reactor |
| 12 | substrate |
| 14 | vessel wall |
| 16 | gas inlet |

| -continued | |
| --- | --- |
| PARTS LIST | |
| 18 | gas outlet |
| 20 | metering value |
| 22 | static chuck |
| 24a–n | thermocouples |
| 25 | resistance heater |
| 26 | chamber |
| 28 | isolation bellows |
| 29 | periodic disturbances |
| 30 | inlet |
| 32 | primary disturbance source |
| 33 | transducer |
| 34 | alternate disturbance source |
| 40 | crossflow reactor |
| 42 | substrate |
| 44 | vessel wall |
| 46 | gas inlet |
| 48 | gas outlet |
| 50 | metering valve |
| 52 | static chuck |
| 54a–n | thermocouples |
| 55 | resistance heater |
| 56 | transducer |
| 58 | primary disturbance |
| 60 | periodic disturbances |
| 62 | alternate disturbance source |
| 64 | chamber |
| 66 | isolation bellows |
| 68 | inlet |
| 70 | transducer |

It is claimed:

1. An apparatus for improved chemical vapor deposition on a surface of a substrate, comprising:
   a. a reactor including:
      (1) a vessel having a vessel wall defining an interior chamber;
      (2) a gas inlet communicating with said interior chamber;
      (3) a gas outlet communicating with said interior chamber;
      (4) a chuck having a substrate holding portion;
      (5) a first sonic disturbance generating source for imparting a sonic disturbance; and,
      (6) a second sonic disturbance generating source for imparting a sonic disturbance into said interior chamber; and,
   b. an another chamber attached to the gas inlet, the another chamber having an isolation bellows within the another chamber to receive a disturbance input from the first sonic disturbance generating source and introduce the disturbance input from the first sonic disturbance source through the gas inlet and thence into the interior chamber.

2. The apparatus as defined in claim 1, wherein said chuck is thermally conductive, has a large mass, and has a resistance heater embedded therein.

3. The apparatus as defined in claim 2, wherein said chuck further has at least one thermocouple embedded therein.

4. The apparatus as defined in claim 1, wherein said reactor is a downflow reactor and said vessel is vertically oriented with said gas inlet being located at an upper region of said vessel, said gas outlet being located at a lower region of said vessel, said first sonic disturbance generating source being plumbed to said isolation bellows of said another chamber which is plumbed to said gas inlet, and said second sonic disturbance generating source being located on the exterior of said vessel wall.

5. The apparatus as defined in claim 4, wherein said entire chuck is positioned within said interior chamber.

6. The apparatus as defined in claim 1, wherein said reactor is a crossflow reactor and said vessel is horizontally oriented with said gas inlet being located at one end, said gas outlet being located at the opposite end, said second sonic disturbance generating source being located on the exterior of said vessel wall at said gas outlet end, and said first sonic disturbance generating source being plumbed to said isolation bellows of said another chamber which is plumbed to said gas inlet.

7. The apparatus as defined in claim 6, wherein only said substrate holding portion of said chuck is positioned within said interior chamber.

8. The apparatus as defined in claim 6, wherein an additional sonic disturbance generating source for imparting a sonic disturbance into said interior chamber is located centrally along said vessel on the exterior of said vessel wall.

9. The apparatus as defined in claim 1, wherein said first sonic disturbance generating source and said second sonic disturbance generating source each produces periodic sonic disturbances of wave form.

* * * * *